US009275457B1

(12) United States Patent
Chen

(10) Patent No.: US 9,275,457 B1
(45) Date of Patent: Mar. 1, 2016

(54) REAL-TIME SUBJECT-DRIVEN FUNCTIONAL CONNECTIVITY ANALYSIS

(71) Applicant: International Business Machines Corporation, Armonk, NY (US)

(72) Inventor: Jingyun Chen, London (CA)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 14/471,067

(22) Filed: Aug. 28, 2014

(51) Int. Cl.
| G06K 9/00 | (2006.01) |
| G06T 7/00 | (2006.01) |
| G06T 7/60 | (2006.01) |
| G06T 15/08 | (2011.01) |
| G01R 33/48 | (2006.01) |

(52) U.S. Cl.
CPC .......... *G06T 7/0016* (2013.01); *G01R 33/4806* (2013.01); *G06K 9/00208* (2013.01); *G06T 7/0026* (2013.01); *G06T 7/0046* (2013.01); *G06T 7/602* (2013.01); *G06T 15/08* (2013.01); *G06K 2209/051* (2013.01); *G06T 2207/10012* (2013.01); *G06T 2207/10088* (2013.01); *G06T 2207/20221* (2013.01); *G06T 2207/30016* (2013.01)

(58) Field of Classification Search
USPC ................................................. 382/128, 131
See application file for complete search history.

(56) References Cited

U.S. PATENT DOCUMENTS

| 6,490,472 | B1 * | 12/2002 | Li ......................... A61B 5/055 |
| | | | 128/920 |
| 8,301,225 | B2 | 10/2012 | Sugiyama et al. |
| 2004/0092809 | A1 * | 5/2004 | DeCharms ......... G01R 33/4806 |
| | | | 600/410 |
| 2006/0084858 | A1 * | 4/2006 | Marks ....................... A61B 5/16 |
| | | | 600/407 |

(Continued)

FOREIGN PATENT DOCUMENTS

| CN | 103093087 | 5/2013 |
| CN | 103202692 | 7/2013 |
| EP | 2620179 | 7/2013 |
| WO | WO2013172981 | 11/2013 |

OTHER PUBLICATIONS

Achard et al., A Resilient, Low-Frequency, Small-World Human Brain Functional Network with Highly Connected Association Cortical Hubs, The Journal of Neuroscience, Jan. 4, 2006, 26(1), pp. 63-72.

Bassett et al., Hierarchical Organization of Human Cortical Networks in Health and Schizophrenia, The Journal of Neuroscience, Sep. 10, 2008, 28(37), pp. 9239-9248.

Achard et al., Efficiency and Cost of Economical Bran Functional Networks, PLOS, Computational Biology, Published Feb. 2, 2007, DOI: 10.1371/journal.pcbi.0030017, 17 pages.

Eguiluz et al., Scale-free brain functional networks, dated Feb. 2, 2008, 4 pages.

Fornito et al., Network Scaling Effects in Graph Analytic Studies of Human Resting-State fMRI Data, Frontiers in Systems Neuroscience, Frontiers Media SA, Published online Jun. 17, 2010, doi: 103389/fnsys.2010.00022, 26 pages.

Hagmann et al., Mapping the Structural Core of Human Cerebral Cortex, PLOS Biology, www.plosbiology.org, Jul. 2008, vol. 6, Issue 7, pp. 1479-1493.

He et al., Small-World Anatomical Networks in the Human Brain Revealed by Cortical Thickness from MRI, Cerebral Cortex Oct. 2007; 17: pp. 2407-2419, doi:10.1093/cercor/bhl149, Advance Access publication Jan. 4, 2007.

(Continued)

*Primary Examiner* — John Strege
(74) *Attorney, Agent, or Firm* — Schmeiser, Olsen & Watts, LLP; John Pivnichny

(57) ABSTRACT

A method and associated systems for real-time subject-driven functional connectivity analysis. One or more processors receive an fMRI time series of sequentially recorded, masked, parcellated images that each represent the state of a subject's brain at the image's recording time as voxels partitioned into a constant set of three-dimensional regions of interest. The processors derive an average intensity of each region's voxels in each image and organize these intensity values into a set of time courses, where each time course contains a chronologically ordered list of average intensity values of one region. The processors then identify time-based correlations between average intensities of each pair of regions and represent these correlations in a graphical format. As each subsequent fMRI image of the same subject's brain arrives, the processors repeat this process to update the time courses, correlations, and graphical representation in real time or near-real time.

20 Claims, 5 Drawing Sheets

(56) References Cited

U.S. PATENT DOCUMENTS

| | | | |
|---|---|---|---|
| 2010/0303318 A1 | 12/2010 | Benali et al. | |
| 2011/0301431 A1 | 12/2011 | Greicius et al. | |
| 2013/0034277 A1* | 2/2013 | Cecchi | G06F 19/321 382/128 |
| 2013/0116540 A1* | 5/2013 | Li | A61B 5/055 600/410 |
| 2014/0275960 A1* | 9/2014 | Hubbard | A61B 5/055 600/410 |
| 2014/0343399 A1* | 11/2014 | Posse | A61B 5/055 600/410 |
| 2014/0364721 A1* | 12/2014 | Lee | A61B 5/055 600/411 |
| 2015/0018664 A1* | 1/2015 | Pereira | A61B 5/055 600/410 |
| 2015/0243023 A1* | 8/2015 | Fan | G01R 33/4806 382/131 |
| 2015/0272461 A1* | 10/2015 | Morimoto | A61B 5/04012 600/410 |
| 2015/0294074 A1* | 10/2015 | Kawato | G06T 7/0016 702/19 |

OTHER PUBLICATIONS

Yongnan Ji, Data-driven fMRI data analysis based on parcellation, The University of Nottingham, School of Computer Sciences, Oct. 2010, 210 pages.

Liu et al., Disrupted small-world networks in schizophrenia, doi:10.1093/brain/awn018, (2008), 131, pp. 945-961.

Park et al., Comparison of the small-world topology between anatomical and functional connectivity in the human brain, Physica A 387 (2008) pp. 5958-5962, journal homepage: www.elsevier.com/locate/physa.

Rissman et al., Measuring functional connectivity during distinct stages of a cognitive task, NeuroImage, www.elsevier.com/locate/ynimg, NeuroImage 23 (2004) pp. 752-763.

Rogers et al., Assessing Functional Connectivity in the Human Brain by FMRI, Magnetic resonance imaging, Magn Reson Imaging. Author manuscript: available in PMC Dec. 1, 2008, published in final edited form as: Magn Reson Imaging, Dec. 2007; 25(10): 1347-1357, 18 pages.

Salvador et al., Neurophysiological Architecture of Functional Magnetic Resonance Images of Human Brain, Cerebral Cortex Sep. 2005;15 pp. 1332-1342, doi:10.1093/cercor/bhi016, Advance Access publication Jan. 5, 2005.

Skudlarski et al., Measuring brain connectivity: Diffusion tensor imaging validates resting state temporal correlations, NeuroImage, journal homepage: www.elsevier.com/locate/ynimg, NeuroImage 43 (2008) pp. 554-561.

M.P. Van Den Heuvel et al., Small-world and scale-free organization of voxel-based resting-state functional connectivity in the human brain, NeuroImage, journal homepage: www.elsevier.com/locate/ynimg, NeuroImage 43 (2008) pp. 528-539.

Salvador et al., Undirected graphs of frequency-dependent functional connectivity in whole brain networks, Philosophical Transactions of the Royal Society B: Biological Sciences, The Royal Society, Philos Trans R Soc Lond B Biol Sci. May 29, 2005; 360(1457) 937-946, published online May 29, 2005.doi: 10.1098/rstb.2005.1645, 28 pages.

Tomasi et al., Functional Connectivity and Brain Activation: A Synergistic Approach, Cerebral Cortex Advance Access published May 3, 2013, Cerebral Cortex doi:10.1093/cercor/bht119, 11 pages.

Jian Xu, Blood-oxygen-level-dependent-functional magnetic resonance imaging and diffusion tensor imaging in traumatic brain injury research, Thesis for the degree of Philosophiae Doctor, Trondheim, Feb. 2010, Norwegian University of Science and Technology, Faculty of Medicine, Department of Circulation and Medical Imaging, 115 pages.

Martijn P. Van Den Heuvel et al., Rich-Club Organization of the Human Connectome, Behavioral/Systems/Cognitive, The Journal of Neuroscience, Nov. 2, 2011, 31(44): pp. 15775-15786.

Wang et al., Parcellation-Dependent Small-World Brain Functional Networks: A Resting-State fMRI Study, Human Brain Mapping 30: pp. 1511-1523, (2009).

Zalesky et al., A DTI-Derived Measure of Cortico-Cortical Connectivity, IEEE Transactions on Medical Imaging, vol. 28, No. 7, Jul. 2009, pp. 1023-1036.

\* cited by examiner

REAL-TIME SUBJECT-DRIVEN FUNCTIONAL CONNECTIVITY ANALYSIS

TECHNICAL FIELD

The present invention relates to analyzing results of a functional magnetic resonance imaging study.

BACKGROUND

MRI (magnetic resonance imaging) is a medical-imaging technology often used by radiologists to produce a sequence, or "time series," of high-resolution three-dimensional images of human anatomy. MRI is widely used to diagnose or stage disease without exposing a subject to ionizing radiation.

fMRI (functional MRI) is an application of magnetic resonance imaging technology used to identify regions of a subject's brain and identify how those regions respond to a specific stimulus or task. A region may so respond by exhibiting a degree of "activation," and an fMRI technique that measures such activation responses is known as blood oxygenation level dependent (BOLD) fMRI.

It is possible to construct a generalized three-dimensional map of regions of the brain and that may be superimposed over a three-dimensional MRI image of a brain. When used this way, the map acts like a template that delineates three-dimensional regions of interest comprised by the brain image. Such a generalized template, however, may not accurately identify a region of interest in a specific subject's brain. Furthermore, in some cases, such a template may require extensive "training" with subject-specific data to become reliable, a requirement that may make it impossible to use the template in real time to analyze a stream of fMRI data as it arrives.

BRIEF SUMMARY

A first embodiment of the present invention provides a method for real-time subject-driven functional connectivity analysis, the method comprising:

a processor of a computer system receiving a first brain volume of a time series, wherein the time series comprises a sequence of brain volumes recorded during a first time period, wherein each brain volume of the time series represents a same subject's brain as a three-dimensional set of voxels, wherein each brain volume of the time series was recorded at a unique recording time of a set of recording times, wherein the first brain volume was recorded at an earliest recording time of the set of recording times, wherein a parcellation of the first brain volume identifies a set of three-dimensional regions common to each brain volume of the time series; and wherein a voxel of the first brain volume is characterized by an intensity that represents a level of activation at a unique location within the same subject's brain at a time at which the first brain volume was recorded;

the processor further receiving remaining brain volumes of the time series in an order in which the remaining brain volumes were recorded;

the processor deriving an average intensity of each region of the set of three-dimensional regions in each received brain volume;

the processor generating a set of time courses as a function of the deriving, wherein each course of the set of time courses is associated with one associated region of the set of three-dimensional regions and identifies a time-varying change in an average intensity of the one associated region during the first time period; and the processor detecting a correlation between a first region of the set of three-dimensional regions and a second region of the set of three-dimensional regions during the first time period, as a function of a first time course of the set of time courses associated with the first region and a second time course of the set of time courses associated with the second region.

A second embodiment of the present invention provides a computer program product, comprising a computer-readable hardware storage device having a computer-readable program code stored therein, said program code configured to be executed by a processor of a computer system to implement a method for real-time subject-driven functional connectivity analysis, the method comprising:

a processor of a computer system receiving a first brain volume of a time series, wherein the time series comprises a sequence of brain volumes recorded during a first time period, wherein each brain volume of the time series represents a same subject's brain as a three-dimensional set of voxels, wherein each brain volume of the time series was recorded at a unique recording time of a set of recording times, wherein the first brain volume was recorded at an earliest recording time of the set of recording times, wherein a parcellation of the first brain volume identifies a set of three-dimensional regions common to each brain volume of the time series; and wherein a voxel of the first brain volume is characterized by an intensity that represents a level of activation at a unique location within the same subject's brain at a time at which the first brain volume was recorded;

the processor further receiving remaining brain volumes of the time series in an order in which the remaining brain volumes were recorded;

the processor deriving an average intensity of each region of the set of three-dimensional regions in each received brain volume;

the processor generating a set of time courses as a function of the deriving, wherein each course of the set of time courses is associated with one associated region of the set of three-dimensional regions and identifies a time-varying change in an average intensity of the one associated region during the first time period; and the processor detecting a correlation between a first region of the set of three-dimensional regions and a second region of the set of three-dimensional regions during the first time period, as a function of a first time course of the set of time courses associated with the first region and a second time course of the set of time courses associated with the second region.

A third embodiment of the present invention provides a computer system comprising a processor, a memory coupled to said processor, and a computer-readable hardware storage device coupled to said processor, said storage device containing program code configured to be run by said processor via the memory to implement a method for real-time subject-driven functional connectivity analysis, the method comprising:

a processor of a computer system receiving a first brain volume of a time series, wherein the time series comprises a sequence of brain volumes recorded during a first time period, wherein each brain volume of the time series represents a same subject's brain as a three-dimensional set of voxels, wherein each brain volume of the time series was recorded at a unique recording time of a set of recording times, wherein the first brain volume was recorded at an earliest recording time of the set of recording times, wherein a parcellation of the first brain volume identifies a set of three-dimensional regions common to each brain volume of the time series; and wherein a voxel of the first brain volume is characterized by an intensity that represents a level of activation at a unique location within the same subject's brain at a time at which the first brain volume was recorded;

the processor further receiving remaining brain volumes of the time series in an order in which the remaining brain volumes were recorded;

the processor deriving an average intensity of each region of the set of three-dimensional regions in each received brain volume;

the processor generating a set of time courses as a function of the deriving, wherein each course of the set of time courses is associated with one associated region of the set of three-dimensional regions and identifies a time-varying change in an average intensity of the one associated region during the first time period; and the processor detecting a correlation between a first region of the set of three-dimensional regions and a second region of the set of three-dimensional regions during the first time period, as a function of a first time course of the set of time courses associated with the first region and a second time course of the set of time courses associated with the second region.

DETAILED DESCRIPTION fMRI (functional magnetic resonance imaging) is a method for identifying a change in a level of activation of a region of a subject's brain. A brain region's level of activation may change when the subject receives a stimulus, performs a task, or experiences another experimental condition.

An fMRI study produces a chronologically ordered sequence (or "time series") of MRI (magnetic resonance imaging) images, each of which represents a three-dimensional "snapshot" of the subject's brain volume at a unique time at which the image was recorded. Each 3D representation of the subject's brain volume shows a level of neuronal activation at the image's recording time at each three-dimensional point comprised by the brain volume. A difference between two activation levels may be represented in the image as a corresponding difference in color, brightness, density, or an other characteristic of a voxel of the image. In some implementations, a level of activation of a region of a brain volume may be a function of a blood oxygenation level dependent (BOLD) signal that identifies a level of neuronal activation in that region.

An fMRI series may be further analyzed to identify couplings between regions of a brain that may work together to perform a particular type of function or to respond to a specific class of stimulus, a relationship known as "functional connectivity." Such relationships may in some cases be inferred from correlations or covariances among time measurements associated with changes in levels of activation of such regions. If two regions, for example, activate simultaneously every time a subject experiences a pinprick stimulus, those two regions may be deemed to be functionally connected.

Embodiments of the present invention comprise a method and systems that analyze such time series in real time, as each image of the time series is received, in order to identify time-varying correlations among regions of interest of the brain volume. This task comprises identifying a set of three-dimensional regions of interest on a first received brain volume image, identifying an average level of activation of each region of interest on each image of the time series as a function of the identification performed on the first received image, organizing these identified levels into chronologically ordered groups that each comprise identified levels associated with one region of interest, identifying correlations between regions as a function of these groups, and translating such correlations into a nondirected graph.

This procedure may then be repeated for a subsequent time series and the resulting graphs may be compared or analyzed to identify time-varying correlations among the subject's responses to certain stimuli, tasks, or other conditions.

Figure 1:
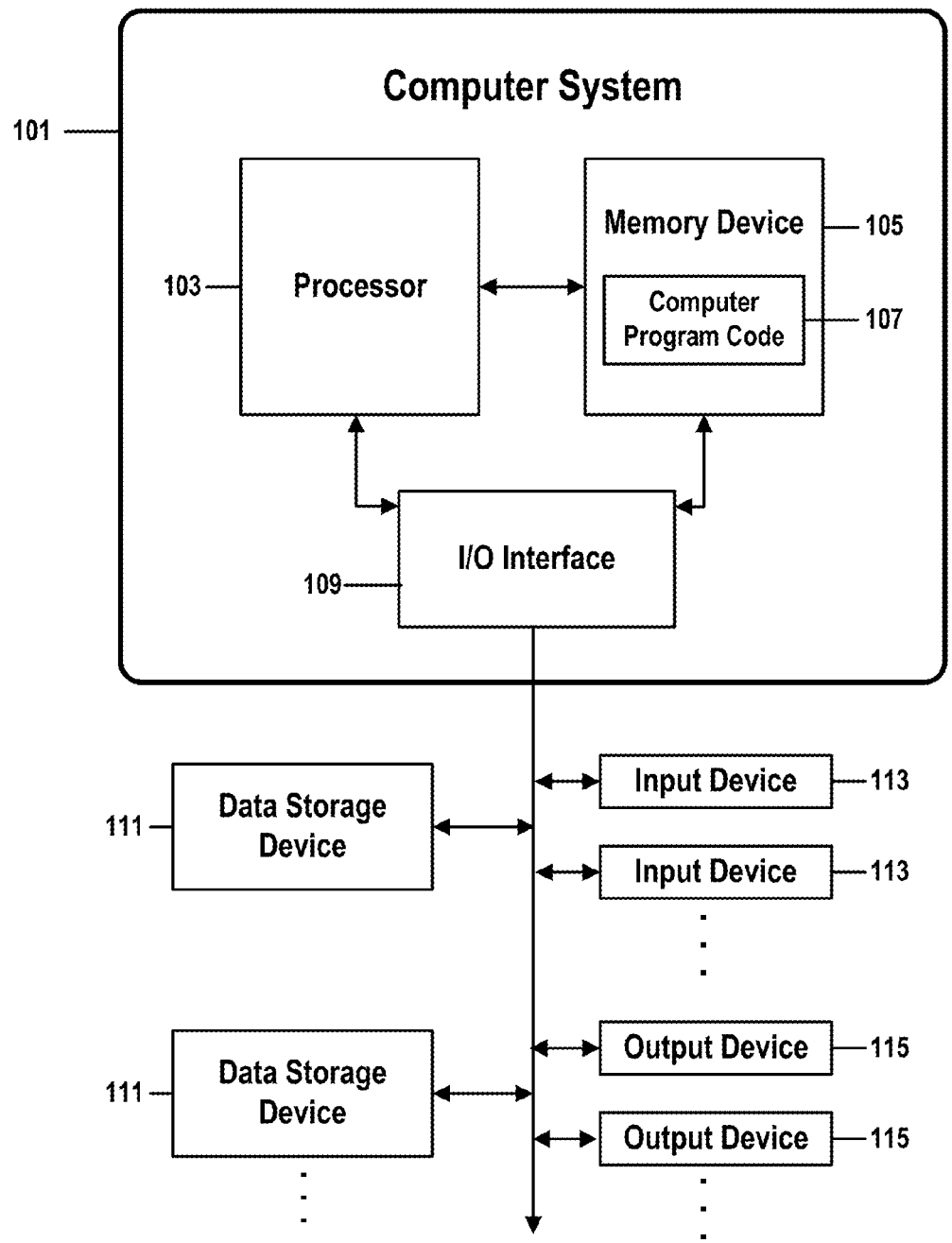
FIG. 1 shows the structure of a computer system and computer program code that may be used to implement a method for real-time subject-driven functional connectivity analysis in accordance with embodiments of the present invention.

FIG. 1 shows a structure of a computer system and computer program code that may be used to implement a method for real-time subject-driven functional connectivity analysis in accordance with embodiments of the present invention. FIG. 1 refers to objects 101-115.

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In FIG. 1, computer system 101 comprises a processor 103 coupled through one or more I/O Interfaces 109 to one or more hardware data storage devices 111 and one or more I/O devices 113 and 115.

Hardware data storage devices 111 may include, but are not limited to, magnetic tape drives, fixed or removable hard disks, optical discs, storage-equipped mobile devices, and solid-state random-access or read-only storage devices. I/O devices may comprise, but are not limited to: input devices 113, such as keyboards, scanners, handheld telecommunications devices, touch-sensitive displays, tablets, biometric readers, joysticks, trackballs, or computer mice; and output devices 115, which may comprise, but are not limited to printers, plotters, tablets, mobile telephones, displays, or sound-producing devices. Data storage devices 111, input devices 113, and output devices 115 may be located either locally or at remote sites from which they are connected to I/O Interface 109 through a network interface.

Processor 103 may also be connected to one or more memory devices 105, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 105 contains stored computer program code 107, which is a computer program that comprises computer-executable instructions. The stored computer program code includes a program that implements a method for real-time subject-driven functional connectivity analysis in accordance with embodiments of the present invention, and may implement other embodiments described in this specification, including the methods illustrated in FIGS. 1-5. The data storage devices 111 may store the computer program code 107. Computer program code 107 stored in the storage devices 111 is configured to be executed by processor 103 via the memory devices 105. Processor 103 executes the stored computer program code 107.

Thus the present invention discloses a process for supporting computer infrastructure, integrating, hosting, maintaining, and deploying computer-readable code into the computer system 101, wherein the code in combination with the computer system 101 is capable of performing a method for real-time subject-driven functional connectivity analysis.

Any of the components of the present invention could be created, integrated, hosted, maintained, deployed, managed, serviced, supported, etc. by a service provider who offers to facilitate a method for real-time subject-driven functional connectivity analysis. Thus the present invention discloses a process for deploying or integrating computing infrastructure, comprising integrating computer-readable code into the computer system 101, wherein the code in combination with the computer system 101 is capable of performing a method for real-time subject-driven functional connectivity analysis.

One or more data storage units 111 (or one or more additional memory devices not shown in FIG. 1) may be used as a computer-readable hardware storage device having a computer-readable program embodied therein and/or having other data stored therein, wherein the computer-readable program comprises stored computer program code 107. Generally, a computer program product (or, alternatively, an article of manufacture) of computer system 101 may comprise said computer-readable hardware storage device.

While it is understood that program code 107 for cross-retail marketing based on analytics of multichannel clickstream data may be deployed by manually loading the program code 107 directly into client, server, and proxy computers (not shown) by loading the program code 107 into a computer-readable storage medium (e.g., computer data storage device 111), program code 107 may also be automatically or semi-automatically deployed into computer system 101 by sending program code 107 to a central server (e.g., computer system 101) or to a group of central servers. Program code 107 may then be downloaded into client computers (not shown) that will execute program code 107.

Alternatively, program code 107 may be sent directly to the client computer via e-mail. Program code 107 may then either be detached to a directory on the client computer or loaded into a directory on the client computer by an e-mail option that selects a program that detaches program code 107 into the directory.

Another alternative is to send program code 107 directly to a directory on the client computer hard drive. If proxy servers are configured, the process selects the proxy server code, determines on which computers to place the proxy servers' code, transmits the proxy server code, and then installs the proxy server code on the proxy computer. Program code 107 is then transmitted to the proxy server and stored on the proxy server.

In one embodiment, program code 107 for cross-retail marketing based on analytics of multichannel clickstream data is integrated into a client, server and network environment by providing for program code 107 to coexist with software applications (not shown), operating systems (not shown) and network operating systems software (not shown) and then installing program code 107 on the clients and servers in the environment where program code 107 will function.

The first step of the aforementioned integration of code included in program code 107 is to identify any software on the clients and servers, including the network operating system (not shown), where program code 107 will be deployed that are required by program code 107 or that work in conjunction with program code 107. This identified software includes the network operating system, where the network operating system comprises software that enhances a basic operating system by adding networking features. Next, the software applications and version numbers are identified and compared to a list of software applications and correct version numbers that have been tested to work with program code 107. A software application that is missing or that does not match a correct version number is upgraded to the correct version.

A program instruction that passes parameters from program code 107 to a software application is checked to ensure that the instruction's parameter list matches a parameter list required by the program code 107. Conversely, a parameter passed by the software application to program code 107 is checked to ensure that the parameter matches a parameter required by program code 107. The client and server operating systems, including the network operating systems, are identified and compared to a list of operating systems, version numbers, and network software programs that have been tested to work with program code 107. An operating system, version number, or network software program that does not match an entry of the list of tested operating systems and version numbers is upgraded to the listed level on the client computers and upgraded to the listed level on the server computers.

After ensuring that the software, where program code 107 is to be deployed, is at a correct version level that has been tested to work with program code 107, the integration is completed by installing program code 107 on the clients and servers.

Embodiments of the present invention may be implemented as a method performed by a processor of a computer system, as a computer program product, as a computer system, or as a processor-performed process or service for supporting computer infrastructure.

Figure 2A:
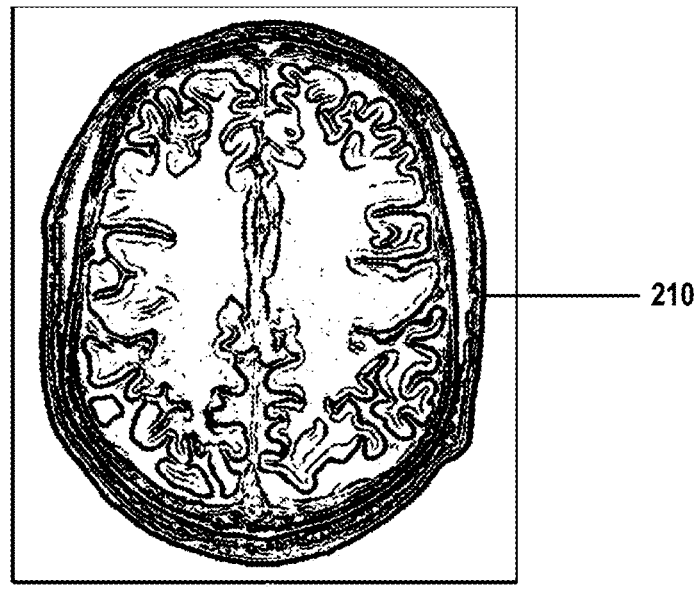
FIG. 2A shows a two-dimensional reproduction of an exemplary fMRI three-dimensional image.

FIG. 2A shows a two-dimensional reproduction 210 of an exemplary MRI three-dimensional image. Although the original MRI image may have depicted additional elements of a subject's head, such as the subject's skull, eyes, or spine, the reproduction 210 here depicts only the brain volume itself. The explanation of the method of FIG. 3 below describes a skull-stripping procedure by which an original, raw MRI image may be converted to a skull-stripped three-dimensional brain volume analogous to the two-dimensional reproduction 210 shown here.

Figure 2B:
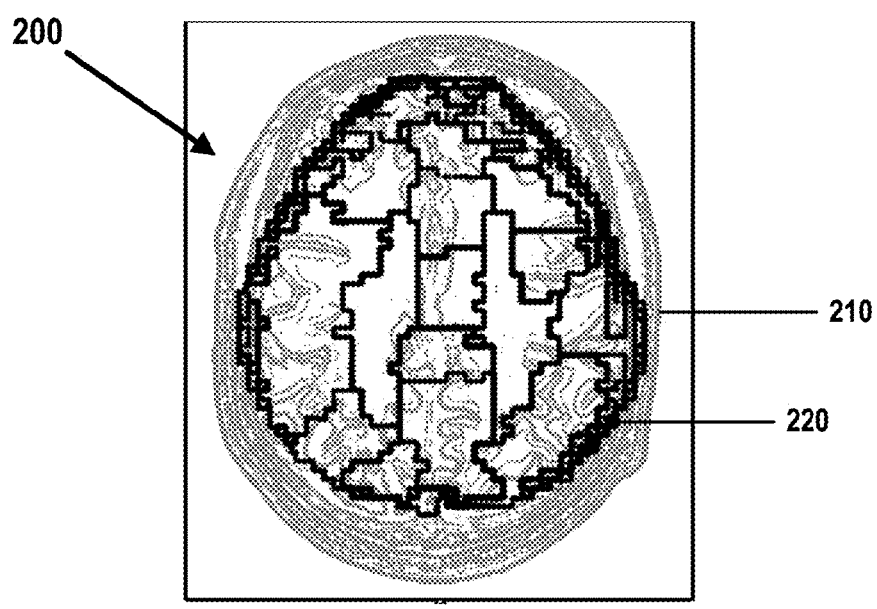
FIG. 2B shows a two-dimensional representation of a three-dimensional brain template overlaid upon the skull-stripped brain volume of FIG. 2B.

FIG. 2B shows a two-dimensional representation 200 of a three-dimensional brain template 220 (shown as a black line figure) overlaid upon the skull-stripped brain volume 210 of FIG. 2A (shown in gray).

At least two classes of three-dimensional templates may be overlaid onto an MRI brain volume. A structural template might delineate three-dimensional regions of a brain volume that are each associated with a distinct physical structure of the brain. That is, a structural template might identify a three-dimensional region of a brain volume as a region of interest if the neurons in that region are physically or anatomically attached to each other. Two such regions might be considered to be structurally connected if those two regions are physically or anatomically attached to each other.

Embodiments of the present invention, however, may comprise use of a functional template that delineates regions of interest of a brain volume that are each associated with a particular function. If, for example, neurons within one contiguous area of a brain volume activate when a subject performs a specific class of task, a functional template might identify that contiguous region as a region of interest. Similarly, two neural populations are considered to be functionally connected if their neurons activate at a substantially similar set of times or in response to a same stimulus.

Here, two-dimensional representation 220 represents a three-dimensional functional brain template that comprises regions of interest created by partitioning (or "parcellating") the three-dimensional MRI brain volume represented by two-dimensional representation 210. As described above, each distinct three-dimensional region delineated by this functional brain template comprises a distinct set of neural matter that is associated with a distinct brain function.

The fact that the two-dimensional representation 220 of the exemplary functional brain template outlines a specific set of regions shown in FIG. 2B should not be construed to imply that this set of regions is the only set that might be identified by a functional map within the scope of embodiments of the present invention. As will be explained in the discussion of FIG. 3 below, any known parcellation method capable of creating or overlaying a functional brain template over a brain volume may be used in accordance with embodiments of the present invention. A functional brain template might, for example, identify a different number of regions, regions of different shape, or regions that are characterized by different connectivities, correlations, dependencies, or other relationships, than the set of shapes shown in FIG. 2B.

Figure 3:
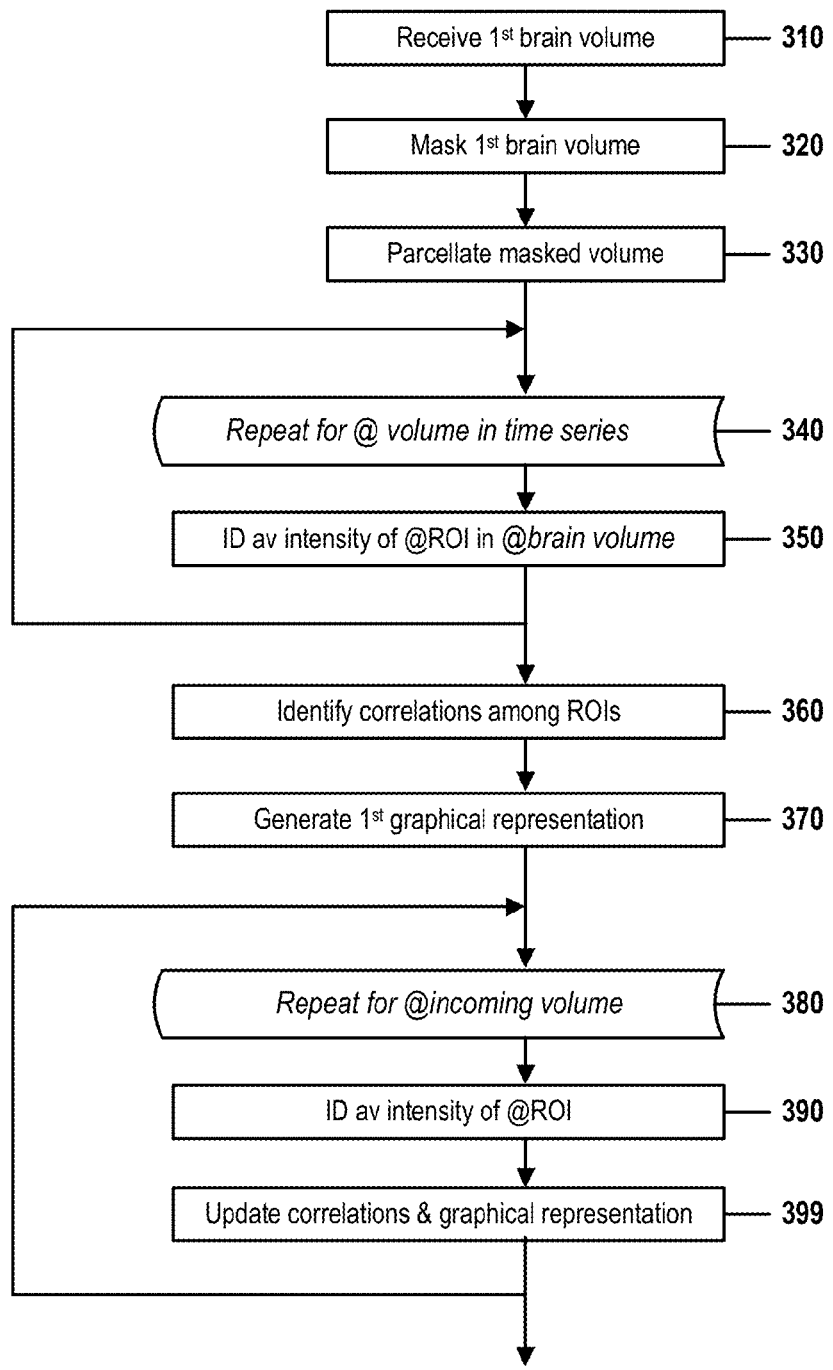
FIG. 3 is a flow chart that illustrates steps of a method for real-time subject-driven functional connectivity analysis in accordance with embodiments of the present invention.

FIG. 3 is a flow chart that illustrates steps of a method for real-time subject-driven functional connectivity analysis in accordance with embodiments of the present invention. FIG. 3 comprises steps 310-399.

In step 310, one or more processors (henceforth referred to as "the processor") receive a first image of a first time series of three-dimensional images of a subject's brain. A time series, as is known in the art, comprises a chronologically ordered set of three-dimensional representations of the subject's brain (referred to here as three-dimensional "brain volumes") recorded during a fixed period of time.

Each brain volume of the first time series is thus associated with a unique recording time within a first fixed period of time, and represents a state of the subject's brain at a unique recording time within the first fixed period of time.

In one example, an fMRI time series may comprise a sequence of 100 MRI images of a subject's head recorded sequentially over a first fixed period of 100 seconds. In this example, each image might be recordings at constant one-second intervals, but in other examples, the interval of time between recordings might not be constant throughout the duration of the 100-second fixed period of time.

In this example, the first brain volume of this sequence might be associated with a unique recording time of 00:00:00 and would represent a state of the subject's brain at time 00:00:00. The second brain volume of the sequence might be associated with a recording time of 00:00:01 (one second after initial time 00:00:00) and would represent a state of the subject's brain at time 00:00:01. The final brain volume of the series might be associated with a recording time of 00:01:40 (one minute and 40 seconds (or 100 seconds) after initial time 00:00:00) and would represent a state of the subject's brain at time 00:01:40.

A raw MRI image is similar to a three-dimensional version of an X-ray image a part of the subject's body. In fMRI analysis, this image is generally that of the subject's head, including both a three-dimensional brain volume and other elements, such as eyes or cervical spine. In embodiments wherein the processor in this step receives the first image as such a raw MRI image, steps 320 and 330 will remove the undesired elements and will overlay a brain map onto the brain volume comprised by this first image. In other embodiments, however, the first image may be received after either step 320 or 330, or both, have already been performed on the first image. In such cases, the processor may not perform what would be a redundant performance of step 320 or 330, or both.

Each MRI image is recorded as a three-dimensional graphical image and represents a three-dimensional brain volume (as well as any other element represented by the image) as a set of voxels, where a voxel, as is known in the art, is a three-dimensional analog of a pixel that identifies a smallest volume element of a three-dimensional image.

In some embodiments, this first received image may not be the first image of the first time series to be recorded. In some embodiments, this first received image may not be the first image of the time series to be recorded, but is instead the earliest-recorded image of the time series to be processed or received by the processor when performing the method of FIG. 3. In some embodiments, this first received image is simply the first image of the time series to be received.

In step 320, if the first fMRI image received in step 310 comprises elements other than the subject's brain volume 210 (shown in FIG. 2A), or other than elements necessary in order to perform subsequent steps of a method of FIG. 3, they are stripped or masked from the image.

In some embodiments, this stripping or masking may be performed by the processor that received the first image in step 310. In other embodiments, this stripping or masking may be performed by an external means, such as by a module of a hardware or software entity that records, processes, communicates, or otherwise performs some activity related to the creation or utilization of the first fMRI time series.

This stripping or masking, which may be similar to a known procedure referred to as "skull-stripping," removes elements of the received first image that are not required to perform subsequent steps of the method of FIG. 3. In some embodiments, this stripping or masking deletes elements of the received first image that do not represent part of the subject's actual brain volume, leaving an image that consists solely of a brain volume 210.

The stripping is performed by means known to those skilled in the art. Such means may, for example, comprise one or more techniques that include manually or automatically identifying structures to be stripped out, and then associating voxels representing elements to be stripped out with a transparency value of 100%; creating a mask or a masking layer that hides or facilitates a deletion of such voxels, or adjusting another characteristic of each such voxel, such as reducing the voxel's intensity or brightness to zero.

In embodiments of the present invention, an intensity value of a voxel comprised by a brain volume of an MRI image identifies a level of activation, an amount of oxygen in blood flow, or a value of an other parameter of interest at a location within the subject's brain that corresponds to a three-dimensional location of the voxel in the brain volume of the MRI image at the time the image was recorded. In other embodiments, the level of activation, amount of oxygen in blood flow, or value of an other parameter of interest may be represented or identified by a value of a different characteristic of the voxel, such as brightness, color, hue, or transparency.

At the conclusion of step 320, the first received MRI image may represent only elements of the raw MRI image, as captured, that are needed to perform subsequent steps of a method of FIG. 3. In some embodiments, these only elements comprise only voxels that represent the subject's brain volume 210 at the time at which the first received MRI image was recorded.

In step 330, if the first fMRI image received in step 310 has not already been parcellated to produce a functional template (or "brain map") of the subject's brain volume, such a functional template is created, by means known to those skilled in the art and discussed further below, as a function of the brain volume represented by the skull-stripped first MRI image received in step 310.

The functional template generated in step 330 is then overlaid upon the first-received brain volume comprised by the first image, which was received in step 310. This functional template (represented in two dimensions as item 220 of FIG. 2B), comprises boundaries of a set of regions of interest of the brain volume. Here, each region of interest identified by the functional template is a three-dimensional volume that corresponds to an area of the brain that is associated with a distinct brain function of interest. If, for example, neurons within one contiguous area of a brain volume activate when a subject hears a loud sound or moves a finger, a functional template might identify that contiguous region as a region of interest associated with hearing or with control of muscles of the forearm.

Each region of interest identified by the functional brain template thus comprises one or more contiguous three-dimensional volumes, each represented by one or more contiguous sets of voxels. In three-dimensional space, the functional brain template 220 may comprise a set of closed surfaces that each encloses a subset of a set of voxels comprised by the brain volume 210. In some embodiments, most or all regions of interest may be of similar size and volume.

In some embodiments, once the first received brain volume 210 has been parcellated into distinct functional areas and a corresponding functional brain template 220 has been generated and overlaid upon the brain volume of the first received MRI image, this generated functional brain template 220 may be used for all subsequent received MRI images of the same subject. This is possible because, in a properly conducted fMRI study, a representation of a position, size, and shape of a subject's brain volume may be expected to remain constant in every received MRI image. This consistency may extend to representations of the subject's brain in every MRI image of subsequent time series of a same study.

For this reason, the stripping or masking of step 320 may need to be performed only one time, on the first received image, because subsequent images of the current or future time series of the same study may be expected to represent each region of interest of the subject's brain volume by a set of voxels that remains substantially equivalent in position, size, and shape in each image.

In some embodiments, this parcellation and generation of a functional template 220 may be performed by the processor that received the first image in step 310. In other embodiments, this parcellation and generation may be performed by external means, such as by a module of a hardware or software entity that records, processes, communicates, or otherwise performs some activity related to the creation or utilization of the images comprised by the first time series. Like the stripping or masking of step 320, if performed by external means, the parcellation and generation described here as a procedure of step 330, may be performed before step 310, such that the first received image arrives in step 310 already overlaid with a functional template 220.

As mentioned above, a functional brain template 220 (or "brain map") may be constructed in step 330 by any means known to those skilled in the art as a function of the stripped brain volume 210. One example of such a known means is Poisson Disk Sampling (described by the inventor in: Chen et al., "A study of temporal-spatial resolution and structure consistency for brain network based on Poisson Sphere Sampling templates," The International Conference on Unconventional Computation and Natural Computation, 2014). A functional brain map generated by an embodiment of the present invention may be scaled and structured to precisely overlay the brain volume 210 identified in each image of the received time series, and to precisely identify a location and boundary of each functional region of interest in the particular brain under study.

The method of one-time, single brain-volume, parcellation and generation described herein differs from other methods used in the art. Existing methods of using a predefined anatomical template, for example, require performing a manual parcellation procedure on a structural MRI image, based on anatomical knowledge of the subject or on standardized reference structural images of a brain volume. In order to be used in a functional analysis, such a template must be projected onto lower-resolution, downsampled versions of functional MR images. This downsampling may produce interpolation artifacts that result in misalignment between structural and functional images, and distort the template during functional analysis. Furthermore, such a procedure may produce other inaccuracies because standardized reference templates may not accurately represent the true position, shape, or size of a particular subject's region of interest.

Another method known in the art is that of producing a template by data-driven procedures that construct a template from a "training" data set or by means of a precomputation procedure that relies upon external data sets. These external data set may be collected from previous studies of subjects other than the current target subject, allowing the precomputation to be performed before the current fMRI study of interest begins. These external data sets, however, may not accurately represent a characteristic of the current target subject, and this is especially likely when the current target subject is afflicted with a significant brain disorder. In many cases, data-driven template generation must thus be derived from training data collected and processed during the actual MRI scanning of the current target subject. In some cases, one or more entire time series must be used to generate an acceptable data-driven functional template, making it impossible to perform real-time functional MRI analysis.

Embodiments of the present invention may be distinguished from these known methods because the present invention is subject-oriented, meaning that it does not require a predefined template or external training data before beginning its analysis, it may be performed directly on each brain volume as it is received, it may be initiated after receiving just one brain volume image, and its does not depend on an accuracy of a precomputation of external data.

At the conclusion of step 330, the first received MRI image may represent the subject's brain volume, parcellated into three-dimensional functional areas of interest as a function of a functional template. This parcellation and its associated set of regions of interest may be associated with brain volumes represented by subsequently received images of the current time series by applying the same functional template, generated in step 330, to each subsequently received image in a similar manner.

Steps 340-350 comprise an iterative procedure that is performed once for each received brain volume of the first received time series of the current fMRI study of the current subject. Steps 310-330 do not have to be repeated for each such received volume, so long as a representation of the position, size, and shape of a region of interest of the subject's brain volume may be expected to remain constant in every received MRI image of the first, or subsequent, time series of the current fMRI study of the current subject. The iterative procedure of steps 340-350 may terminate after all brain volumes of the first time series have been received and analyzed by step 350.

In step 350, the processor identifies an average intensity of each region of interest of a brain volume of the current time series. This identification may be performed by means known in the art for obtaining an average intensity voxels within a contiguous region. In one simple example, a spatial average may be identified by arithmetically averaging an intensity of each voxel comprised by the contiguous region. In an other example, a weight map may be assigned to a region of interest to distinguish relative importance of each voxel within the region. In such a case, a spatial average of the region may be derived as a weighted average of all intensities of the voxels within the region.

At the conclusion of step 350, the processor will have assembled a set of time courses of region-of-interest average intensities, one per region, wherein each time course identifies a series of changes in an average intensity of one particular region of interest over the first fixed period of time, during which images of the first time series were recorded.

In one example, a first time series may comprise three brain volumes, respectively recorded at times 0:01, 0:02, and 0:03, and a functional template may identify two regions of interest identified as ROI A and ROI B. Step 330 identifies an average intensity of ROI A of 6 in volume 0:01, 3 in volume 0:02, and 4 in volume 0:03; and further identifies an average intensity of ROI B of 3 in volume 0:01, 5 in volume 0:02, and 1 in volume 0:03. The processor in step 330 then produces a time course for ROI A that comprises an ordered sequence {6,3,4} and a time course for ROI B that comprises an ordered sequence {3,5,1}. In a real-world example, the processor might in step 330 produce a great many such time courses, one for each region of interest identified by the functional brain template, and each such time course might comprise a great number of average intensity values, one such value for each recorded brain volume of the first time course.

In some embodiments, a first iteration of steps 340-350 may be performed upon the first received image received in step 310.

In step 360, the processors identify time-dependent correlations among the regions of interest identified by the functional brain template, where this identifying is performed as a function of the time courses generated in step 350. These correlations each identify similarities in the ways that average intensities of a pair of regions of interest change over time.

If, for example, the subject's brain responds to a flashing light stimulus by exhibiting substantially simultaneous heightened activation regions of interest ROI A and ROI B, the processor might infer a correlation between functional areas of the subject's brain represented by ROI A and ROI B during the time that the brain responded to the flashing light. As described above, heightened activation of a region may be indicated in a brain volume by a greater average intensity of the voxels identified by the functional template as representing that region.

Known methods of identifying such correlations may be implementation-dependent, or may be a function of factors that include, but are not limited to, a frequency at which MRI images of a time series are recorded, a resolution of each such image, a number of regions of interest identified by a functional template, and a number of images comprised by a time series.

In one example, a correlation may be identified by computing a correlation coefficient as a function of values of a pair of time courses generated in step 350, and by then determining whether the resulting coefficient exceeds a threshold value. One such coefficient is the Pearson Product-Moment Correlation Coefficient, which may be computed by a known procedure that is well-documented in related scientific literature and in numerous online references, including the Internet's Wikipedia site. (See, e.g., http://en.wikipedia.org/wiki/Pearson_product-moment_correlation_coefficient.)

Other known methods of identifying or quantifying correlations, functional connectivity, or another type of linkage include mutual information (which measures mutual dependence between random variables) and spectral coherence (which generates a statistic that can be used to analyze a relation between a pair of data sets).

In some embodiments, the processor may in this step merely identify whether a correlation between a pair of regions either exists or does not exist or whether a degree of correlation satisfies a threshold condition. In other embodiments, a correlation may be assigned a distinct value that permits relative strengths of correlations to be compared or ranked.

At the conclusion of step 360, the processors will have identified correlations between pairs of regions of interest that occur during the fixed period of time during which the first time series was recorded. Such a correlation between two regions during a particular period of time indicates potential functional connectivity, or an other relationship, between two functional areas of the brain that correspond to the two regions of interest, as identified by the functional template. Such a correlation may further indicate that this potential relationship may be further related to a stimulus or other condition that occurred during that particular period of time.

In step 370, the processor generates a first graphical representation of the subject's brain during the first fixed time period during which the time series was recorded, as a function of the information generated in steps 350 and 360.

Any appropriate type of graphical representation may be generated in this step, including, but not limited to an undirected graph that comprises a set of nodes and a set of non-directional links between pairs of nodes. In other embodiments, a graphical representation may take a form of a tree or of a directed graph that may indicate a directional relationship, such as a dependency relationship, between a pair of regions of interest.

Figure 4:
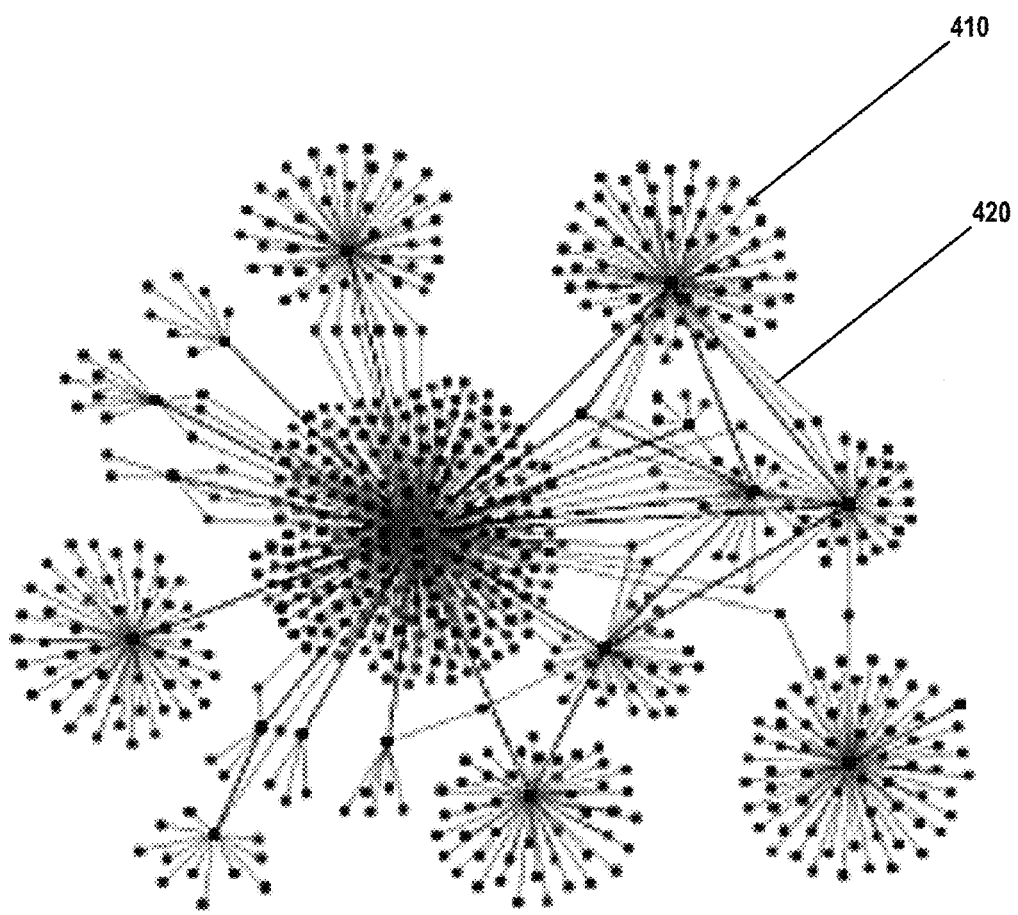
FIG. 4 shows an example of an undirected graph created in accordance with methods of step 370 or step 399 of FIG. 3.

Such a graph is illustrated in FIG. 4, where, as described below, each region of interest identified by the functional template is represented by a node (such as the exemplary node 410 in FIG. 4) of an undirected graph, and each correlation between two regions of interest is represented as a link between two nodes that respectively represent those regions (such as the exemplary link 420 in FIG. 4).

Because an undirected graph may be represented in any of a broad variety of formats, the style of representation shown here in FIG. 4 should not be construed to limit the representation to such style of representation. In other embodiments, each graphical representation generated by step 370 or step 399 that may be taken by such a graph, or by any other graphical representation in accordance with embodiments of the present invention, generated by the processor in step 370.

At the conclusion of step 370, the processor will have generated a first graphical representation of correlations among functional regions of the subject's brain, as a function of a sequence of average intensities of each region inferred from the received brain volumes of the first time series.

Step 380, initiates an iterative procedure of steps 380-399 that performs operations upon subsequently received brain volumes analogous to operations performed upon brain volumes of the first received time series by steps 340-370. The iterative procedure of steps 380-399 may be performed once for each brain volume received after the generation of the first graphical representation in step 370, and may be initiated by each such receipt.

Figure 5:
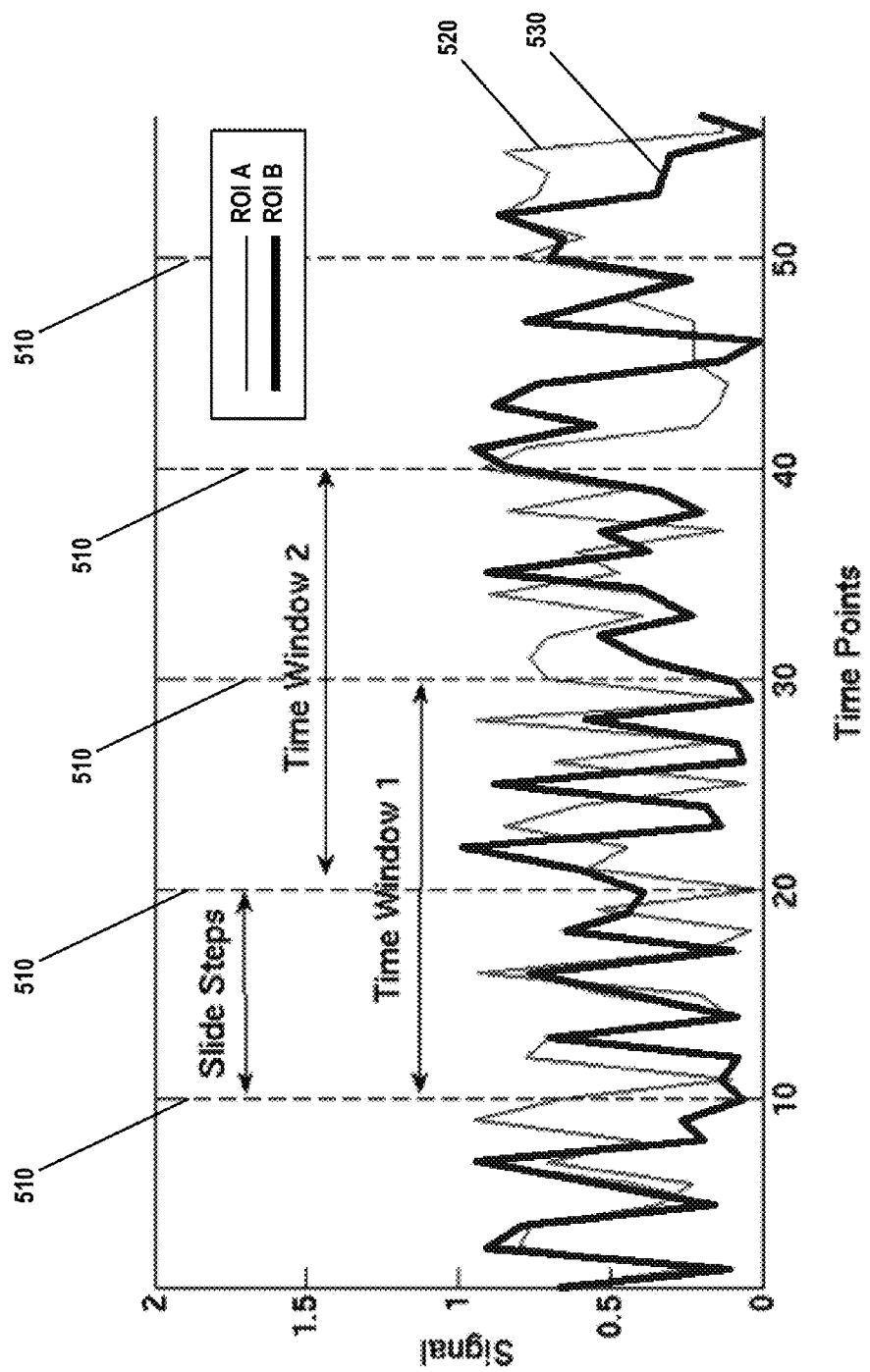
FIG. 5 is a timeline that shows one possible approach to selecting time ranges of data used to generate successive graphical representations in steps 370 and 399 of FIG. 3.

Each iteration generates information that may be used to generate an updated graphical representation of correlations or functional connectivity among regions of the subject's brain, wherein each updated representation represents correlations or connectivity during a time period that is later than, but may overlap, a time period during which data represented by a previous graphical representation was recorded. This "sliding window" time relationship between successive derived correlations or between successive graphical relationships is illustrated in FIG. 5. Such a sliding window approach, while not essential to embodiments of the present invention, allows graphical representations to be generated in real time, as fMRI images are still being recorded, unlike other methods that cannot analyze fMRI images until after the receipt of an entire time series, or of an entire study comprising multiple time series.

In step 390, the processor identifies an average intensity of each region of interest of the most recently received brain volume by a method analogous to a method of step 350. At the conclusion of each iteration of step 390, the processor may have identified an average intensity of each region of interest identified by functional template 220 in step 330 at a time associated with the time at which the most recently received brain volume was recorded.

In some embodiments, the processor at the conclusion of step 390 may identify a time course for each identified region of interest, where each time course of the time courses identified in this iteration of step 390 comprises some or all values of the most-recently derived earlier time course derived for the same region.

In one example, if a most-recent previous iteration of step 390 identified a time course that comprises ten average intensity values of region ROI A, a current iteration of step 390 might update that previous time course by deleting from the earliest intensity value comprised by the time course and adding a most recent intensity value derived during the current iteration of step 390. In such an example, in each iteration of step 390, the processor generates an updated time course for each region of interest, where each such time course identifies ten average-intensity values of a region that are associated with the ten most recently recorded, or the ten most recently received, brain volumes.

This example should not be construed to limit a number of values that may be comprised by a time course exclusively to ten values.

In step 399, the processor updates a most recently generated set of correlations between regions of interest as a function of time courses generated in the most recent iteration of step 390, by means of a method analogous to a method of step 360. This updating, like the updating of step 390, may be performed by adjusting a fixed-duration time range of data from which the generated set of correlations is derived, such that the time range is slid forward in time so as to include a recording time of the most recently received brain volume.

There are many variations of this "sliding window" technique that may be distinguished by parameters such as a number of units of time to slide the time range in each iteration of the procedure of steps 380-399, or by a duration of a time range. In other embodiments, the time range of data from which a set of correlations may be generated may not be fixed in duration. FIG. 5 graphically illustrates one possible implementation of such a sliding window method of selecting time ranges of recorded data.

In step 399, the processor may also update the most recently generated graphical representation previously generated in step 370 or in a most recent previous iteration of step 399. This updating may not be performed during every iteration of the iterative procedure of steps 380-399. An embodiment, for example, might update the most recent graphical representation only after receiving and processing an entire time series or only after receiving and processing an entire set of brain volumes recorded during a specific time period.

In one example, an embodiment might implement a sliding window method in which ten brain volumes are recorded during each fixed-duration time window, and in which each time window begins five recordings after the previous time window. In such an example, if one brain volume is recorded every second, than an initial graphical representation might comprise information inferred from received brain volumes #1-10, a first updated graphical representation might comprise information inferred from received brain volumes #6-15, and a second updated graphical representation might comprise information inferred from received brain volumes #11-20.

In another variation of this example, a sliding window may be defined as sliding one "time unit" between each generation of a graphical representation. Here, if a time unit is defined as one second, then an initial graphical representation might comprise information inferred from images recorded during a time range spanning time 00:01-00:10 (from one second through 10 seconds), a first updated graphical representation might comprise information inferred from images recorded during a time range spanning time 00:02-00:11, and a second updated graphical representation might comprise information inferred from inferred from images recorded during a time range spanning time 00:03-00:12.

Similarly, if an embodiment need not be limited to specific scheduled recording times or to a specific fixed time interval between recordings, these determinations may be made as functions of a generic "time unit" that may represent a fixed or variable duration of time between two successive recordings. Here, an initial graphical representation might comprise information inferred from received brain volumes #1-10, a first updated graphical representation might comprise information inferred from received brain volumes #2-11, and a second updated graphical representation might comprise information inferred from received brain volumes #3-12.

In some embodiments, it is possible that a different number of brain volumes may have been recorded during each time unit. This may happen when time units are fixed in duration, but the duration of time between each pair of successive brain-volume recording times or receipt times may vary. In one example, an embodiment may specify a ten-second fixed time unit and a duration of time between a receipt of two successive brain volumes may vary from two seconds to six seconds. Here, if, during the most recent ten-second time period, one brain volume was received, the processor in step 399 may slide the sliding window by data derived from one brain volume. Similarly, if, during the most recent ten-second time period, three brain volumes were received, the processor in step 399 may slide the sliding window by three data sets derived from the three brain volumes.

As discussed in greater detail in the description of FIG. 5, such an implementation might allow the embodiment to produce updated output in real time, while brain volumes are still being recorded, and might provide sufficient time overlap between each pair of successive updates to facilitate identification of a pattern of correlation that extends across multiple time windows.

At the conclusion of each iteration of the iterative procedure of steps 380-399, the processor will thus have identified an average intensity value of each region of interest at a recording time of the most recently received brain volume and will use these newly identified intensity values to update the previously derived time courses. This updating may comprise sliding the time range associated with each time course so as to include the recording time of the most recently received brain volume.

This updating may then be used to update most recently derived previous sets of correlations or to update the most recently generated graphical representation, wherein the resulting updated correlations or graphical representation comprise information inferred from brain volumes recorded during the updated sliding time range. In some embodiments, this updating of correlations or of a graphical representation updating may not be performed during every iteration of step 399, or may be performed only after a certain number of brain volumes have been received since the most recent previous updating, or only after all brain volumes recorded during a specific range of time have been received.

The iterative procedure of steps 380-399 may continue for as long as MRI images continue to be received. In some embodiments, this may result in a continuous, real-time or near-real-time, updating of a graphical representation of functional connectivities of the subject's brain. In some embodiments, this updating may be represented as a sequence of graphical images or as an animation. In other embodiments, this updating may result in a storage of each updated graphical representation as it is generated.

As described above, FIG. 4 shows an example of an undirected graph created in accordance with methods of step 370 or step 399. In this example, each node 410 represents a region of interest identified by a method of steps 310-330 and each link 420 connects a pair of such nodes, where the link 420 represents a correlation between two regions of interest that are represented by the pair of such nodes.

Many other types of graphical representations, known to those skilled in the art, may be substituted for the type of graph shown in FIG. 4, as a way of visually illustrating correlations among regions of interest identified by embodiments of the present invention, in accordance with a method illustrated in FIG. 3.

FIG. 5, as mentioned above, is a timeline that shows one possible approach to selecting time ranges of data used to generate successive graphical representations in steps 370 and 399. In this figure, a horizontal X axis represents time, calibrated in this example in units of generic "time points," and a vertical Y axis represents an average intensity value of a region of interest. Each plotted point thus represents an average intensity of a specific region of interest at a particular time, as identified in step 350 or 390.

In some embodiments, the time axis may be subdivided into blocks each equal to a fixed or variable duration of time referred to here as a "time window" duration. In FIG. 5, each time window begins at a time-window starting time 510, and adjacent time window starting times are separated by a duration of time referred to here as a "slide step" interval. If, as is shown in the example of FIG. 5, a slide step duration is shorter than a duration of a time window, adjacent time window periods will overlap in time.

In the simplified example of FIG. 5, a relationship between data gathered during adjacent time-window periods is shown for two regions of interest, ROI A and ROI B. Here, a plot 520 of average intensity values for ROI A is superimposed over a plot 530 of intensity values for region of interest ROI B during a set of common time periods. Characteristics of these two curves during one or more periods of the set of common time periods may be analyzed or compared, as explained above, in step 360 or step 399 in order to identify correlations between ROI A and ROI B during those one or more time periods.

In the example of FIG. 5, if time window 1 (spanning time points 10-30) represents a first fixed period of time during which the first time series is recorded, the method of steps 310-370 might derive respective average intensity values for ROI A & ROI B, which are plotted in the graph of FIG. 5 through this first fixed period of time. As described above, embodiments of the present invention similar to those illustrated by the method of FIG. 3 might generate a first graphical representation of a correlation between ROI A and ROI B as a function of these plotted points.

In this example, the processors may continue to receive additional brain volumes recorded after the final recording of time series 1 at time point 30. In such a case, an iteration of the iterative procedure of steps 380-399 would then generate a second graphical representation of average intensities identified during a next period of time, identified in FIG. 5 as "time window 2," spanning time points 20-40. Here, time period 1 and time period 2 overlap in a time range that spans time points 20-30 and each subsequent graphical representation will in a similar manner be generated as a function of data recorded during a time period that overlaps the time period associated with its immediate predecessor.

Variations of this sliding window approach are possible within the scope of the present invention, but in embodiments in which this feature is implemented, if a first graphical representation is generated from data recorded during a first time period, a next graphical representation will be generated from data recorded during a second, later, time period that overlaps the first time period. In this way, successive graphical representations may more smoothly represent time-varying fluctuations in a correlation between regions of interest, and a graphical representation may be less likely to misinterpret a pattern of the recorded data that crosses a boundary between two time windows.

As described above, a magnitude of a time window may be selected as a function of a number of brain-volume recordings, or as a function of a variable "time unit" that is a function of a fixed or variable duration of time between recordings, rather than as a function of a duration of time during which two or more successive MRI brain volumes are recorded. In one example, a graphical representation may be generated in step 399 after a sequence of five brain volumes is received, regardless of when the volumes were recorded, and each graphical representation may be a function of data associated with the ten most recently received volumes. In such a case, a graphical representation may overlap a previous representation by representing data associated with the latest five brain volumes represented by the previous representation.

In some embodiments, the processor performs all functions described in the description of FIG. 3 as being comprised by steps 390 and 399 during each iteration of the iterative procedure of steps 380-399. This means that the processor updates the graphical representation in step 399 after each received brain volume, sliding the time window one "single recording" time unit for each update. In other words, as shown in the flow chart of FIG. 3, a graphical representation is updated once during each iteration of step 399, and each iteration of the iterative procedure of steps 380-399 advances the sliding window one time unit, where a value of the current time unit is incremented by one each time a new brain volume is received in step 380.

FIG. 5 is included here solely to illustrate time relationships among graphical representations generated in step 370 or 399, and should not be construed to be a necessary, user-viewable, output or product of an embodiment of the present invention.

What is claimed is:

1. A method for real-time subject-driven functional connectivity analysis, the method comprising:
   a processor of a computer system receiving a first brain volume of a time series,
      wherein the time series comprises a sequence of brain volumes recorded during a first time period,
      wherein each brain volume of the time series represents a same subject's brain as a three-dimensional set of voxels,
      wherein each brain volume of the time series was recorded at a unique recording time of a set of recording times,
      wherein the first brain volume was recorded at an earliest recording time of the set of recording times,
      wherein a parcellation of the first brain volume identifies a set of three-dimensional regions common to each brain volume of the time series; and
      wherein a voxel of the first brain volume is characterized by an intensity that represents a level of activation at a location within the same subject's brain at a time at which the first brain volume was recorded;
   the processor further receiving remaining brain volumes of the time series in an order in which the remaining brain volumes were recorded;
   the processor deriving an average intensity of each region of the set of three-dimensional regions in each received brain volume;
   the processor generating a set of time courses as a function of the deriving, wherein each course of the set of time courses is associated with one associated region of the set of three-dimensional regions and identifies a time-varying change in an average intensity of the one associated region during the first time period; and
   the processor detecting a correlation between a first region of the set of three-dimensional regions and a second region of the set of three-dimensional regions during the first time period, as a function of a first time course of the set of time courses associated with the first region and a second time course of the set of time courses associated with the second region.

2. The method of claim 1, further comprising:
   the processor creating a graphical representation of the set of time courses that represents functional connectivities between pairs of regions of the set of three-dimensional regions during the first time period.

3. The method of claim 2, wherein the graphical representation comprises a set of nodes and a set of links, wherein each node of the set of nodes represents a unique region of the set of three-dimensional regions, and wherein two nodes of the set of nodes are connected by a link if the processor detected a correlation during the first time period between two regions of the set three-dimensional regions that are represented by the two nodes.

4. The method of claim 3, wherein the links are nondirectional.

5. The method of claim 1, wherein a course of the set of time courses comprises derived average intensities of a corresponding region of the set of three-dimensional regions, ordered chronologically by recording times of the brain volumes from which the derived average intensities of the corresponding region were derived.

6. The method of claim 1, wherein the first brain volume is masked to remove voxels that do not represent the same subject's brain, and wherein the masking is performed prior to the parcellation.

7. The method of claim 1, wherein each region of the set of three-dimensional regions is represented by the masked and parcellated first brain volume as one or more pluralities of voxels each bounded by one or more closed three-dimensional surfaces, wherein no two regions of the set of three-dimensional regions overlap, and wherein a size, position, and shape of one region of the set of three-dimensional regions in the masked and parcellated first brain volume are substantially equivalent to a size, position, and shape of a corresponding region of the set of three-dimensional regions in each subsequently received brain volume.

8. The method of claim 1, wherein the detecting a correlation between two regions of the set of three-dimensional regions comprises computing a Pearson product-moment correlation coefficient of the two regions that meets a threshold value.

9. The method of claim 1, wherein the parcellation is performed by the processor.

10. The method of claim 1, wherein the masking is performed by the processor.

11. The method of claim 5, further comprising:
   the processor receiving an additional brain volume recorded after the first time period, wherein the additional brain volume represents a size, position, and shape of the same subject's brain in a manner similar to that of the first brain volume, represents a size, position, and shape of each region of the set of three-dimensional regions in a manner similar to that of the first brain volume, and identifies an intensity of each voxel comprised by the additional brain volume that represents a level of activation at a location within the same subject's brain at a time at which the additional brain volume was recorded;
   the processor newly deriving a set of newly derived average intensities, wherein each average intensity of the set of newly derived average intensities identifies an average intensity of a region of the set of three-dimensional regions of the additional brain volume;
   the processor assembling a set of updated time courses, wherein a first updated time course of the set of updated time courses is assembled by replacing the first time course's chronologically oldest average intensity with an average intensity of the set of newly derived average intensities of the first region and a second updated time course of the set of updated time courses is assembled by replacing the second time course's chronologically oldest average intensity with an average intensity of the set of newly derived average intensities of the second region;
   the processor updating the correlation between the first region and the second region as a function of the first updated first time course and the second updated time course; and
   the processor updating the graphical representation to represent the updated correlation.

12. The method of claim 1, further comprising providing at least one support service for at least one of creating, integrating, hosting, maintaining, and deploying computer-readable program code in the computer system, wherein the computer-readable program code in combination with the computer system is configured to implement the receiving, further receiving, deriving, generating, and detecting.

13. A computer program product, comprising a computer-readable hardware storage device having a computer-readable program code stored therein, said program code configured to be executed by a processor of a computer system to implement a method for real-time subject-driven functional connectivity analysis, the method comprising:
   the processor receiving a first brain volume of a time series,
      wherein the time series comprises a sequence of brain volumes recorded during a first time period,
      wherein each brain volume of the time series represents a same subject's brain as a three-dimensional set of voxels,
      wherein each brain volume of the time series was recorded at a unique recording time of a set of recording times,
      wherein the first brain volume was recorded at an earliest recording time of the set of recording times,
      wherein a parcellation of the first brain volume identifies a set of three-dimensional regions common to each brain volume of the time series; and
      wherein a voxel of the first brain volume is characterized by an intensity that represents a level of activation at a unique location within the same subject's brain at a time at which the first brain volume was recorded;
   the processor further receiving remaining brain volumes of the time series in an order in which the remaining brain volumes were recorded;
   the processor deriving an average intensity of each region of the set of three-dimensional regions in each received brain volume;
   the processor generating a set of time courses as a function of the deriving, wherein each course of the set of time courses is associated with one associated region of the set of three-dimensional regions and identifies a time-varying change in an average intensity of the one associated region during the first time period; and
   the processor detecting a correlation between a first region of the set of three-dimensional regions and a second region of the set of three-dimensional regions during the first time period, as a function of a first time course of the set of time courses associated with the first region and a second time course of the set of time courses associated with the second region.

14. The computer program product of claim 13, further comprising:
   the processor creating a graphical representation of the set of time courses that represents functional connectivities between pairs of regions of the set of three-dimensional regions during the first time period.

15. The computer program product of claim 13, wherein a course of the set of time courses comprises derived average intensities of a corresponding region of the set of three-dimensional regions, ordered chronologically by recording times of the brain volumes from which the derived average intensities of the corresponding region were derived.

16. The computer program product of claim 15, further comprising:
   the processor receiving an additional brain volume recorded after the first time period, wherein the additional brain volume represents a size, position, and shape of the same subject's brain in a manner similar to that of the first brain volume, represents a size, position, and shape of each region of the set of three-dimensional regions in a manner similar to that of the first brain volume, and identifies an intensity of each voxel comprised by the additional brain volume that represents a level of activation at a location within the same subject's brain at a time at which the additional brain volume was recorded;
   the processor newly deriving a set of newly derived average intensities, wherein each average intensity of the set of newly derived average intensities identifies an average intensity of a region of the set of three-dimensional regions of the additional brain volume;
   the processor assembling a set of updated time courses, wherein a first updated time course of the set of updated time courses is assembled by replacing the first time course's chronologically oldest average intensity with an average intensity of the set of newly derived average intensities of the first region and a second updated time course of the set of updated time courses is assembled by replacing the second time course's chronologically oldest average intensity with an average intensity of the set of newly derived average intensities of the second region;
   the processor updating the correlation between the first region and the second region as a function of the first updated first time course and the second updated time course; and
   the processor updating the graphical representation to represent the updated correlation.

17. A computer system comprising a processor, a memory coupled to said processor, and a computer-readable hardware storage device coupled to said processor, said storage device containing program code configured to be run by said processor via the memory to implement a method for real-time subject-driven functional connectivity analysis, the method comprising:
   the processor receiving a first brain volume of a time series,
      wherein the time series comprises a sequence of brain volumes recorded during a first time period,
      wherein each brain volume of the time series represents a same subject's brain as a three-dimensional set of voxels,
      wherein each brain volume of the time series was recorded at a unique recording time of a set of recording times,
      wherein the first brain volume was recorded at an earliest recording time of the set of recording times,
      wherein a parcellation of the first brain volume identifies a set of three-dimensional regions common to each brain volume of the time series; and
      wherein a voxel of the first brain volume is characterized by an intensity that represents a level of activation at a unique location within the same subject's brain at a time at which the first brain volume was recorded;
   the processor further receiving remaining brain volumes of the time series in an order in which the remaining brain volumes were recorded;
   the processor deriving an average intensity of each region of the set of three-dimensional regions in each received brain volume;
   the processor generating a set of time courses as a function of the deriving, wherein each course of the set of time courses is associated with one associated region of the set of three-dimensional regions and identifies a time-varying change in an average intensity of the one associated region during the first time period; and
   the processor detecting a correlation between a first region of the set of three-dimensional regions and a second region of the set of three-dimensional regions during the first time period, as a function of a first time course of the set of time courses associated with the first region and a second time course of the set of time courses associated with the second region.

18. The computer system of claim 17, further comprising:

the processor creating a graphical representation of the set of time courses that represents functional connectivities between pairs of regions of the set of three-dimensional regions during the first time period.

19. The computer system of claim 17, wherein a course of the set of time courses comprises derived average intensities of a corresponding region of the set of three-dimensional regions, ordered chronologically by recording times of the brain volumes from which the derived average intensities of the corresponding region were derived.

20. The computer system of claim 19, further comprising:

the processor receiving an additional brain volume recorded after the first time period, wherein the additional brain volume represents a size, position, and shape of the same subject's brain in a manner similar to that of the first brain volume, represents a size, position, and shape of each region of the set of three-dimensional regions in a manner similar to that of the first brain volume, and identifies an intensity of each voxel comprised by the additional brain volume that represents a level of activation at a location within the same subject's brain at a time at which the additional brain volume was recorded;

the processor newly deriving a set of newly derived average intensities, wherein each average intensity of the set of newly derived average intensities identifies an average intensity of a region of the set of three-dimensional regions of the additional brain volume;

the processor assembling a set of updated time courses, wherein a first updated time course of the set of updated time courses is assembled by replacing the first time course's chronologically oldest average intensity with an average intensity of the set of newly derived average intensities of the first region and a second updated time course of the set of updated time courses is assembled by replacing the second time course's chronologically oldest average intensity with an average intensity of the set of newly derived average intensities of the second region;

the processor updating the correlation between the first region and the second region as a function of the first updated first time course and the second updated time course; and the processor updating the graphical representation to represent the updated correlation.

* * * * *